United States Patent
Ishikawa et al.

(10) Patent No.: US 7,203,921 B2
(45) Date of Patent: Apr. 10, 2007

(54) METHOD AND SYSTEM FOR DESIGNING AN INTEGRATED CIRCUIT WITH REDUCED NOISE

(75) Inventors: Yasuyuki Ishikawa, Kariya (JP); Kouji Ichikawa, Kariya (JP)

(73) Assignee: Denso Corporation, Kariya (JP)

( * ) Notice: Subject to any disclaimer, the term of this patent is extended or adjusted under 35 U.S.C. 154(b) by 430 days.

(21) Appl. No.: 10/778,136

(22) Filed: Feb. 17, 2004

(65) Prior Publication Data

US 2004/0168142 A1  Aug. 26, 2004

(30) Foreign Application Priority Data

Feb. 25, 2003  (JP)  .............. 2003-047473

(51) Int. Cl.
*G06F 17/50* (2006.01)
(52) U.S. Cl. ........................... 716/10; 716/5
(58) Field of Classification Search .............. 716/1, 716/5, 8–10; 257/532
See application file for complete search history.

(56) References Cited

U.S. PATENT DOCUMENTS 6,054,751 A * 4/2000 Ichikawa et al. ........... 257/532
2004/0103381 A1* 5/2004 Shinomiya .................... 716/5

FOREIGN PATENT DOCUMENTS

JP   A-2001-175702    6/2001
JP   1 143 507 A1 * 10/2001

* cited by examiner

*Primary Examiner*—Vuthe Siek
(74) *Attorney, Agent, or Firm*—Posz Law Group, PLC

(57) ABSTRACT

Noise current flowing to the outside of an IC (1) with respect to the capacitance value and arrangement location of a bypass capacitor (4) is calculated on the basis of the impedance of current paths (P1, P2) passing via a bypass capacitor (4) at the outside of the IC (1) and the impedance of the inside of IC (1) when viewed from power supply terminals (2, 3) of the IC (1). The capacitance value and arrangement location of the bypass capacitor (4) are determined on the basis of the calculation result.

14 Claims, 5 Drawing Sheets

METHOD AND SYSTEM FOR DESIGNING AN INTEGRATED CIRCUIT WITH REDUCED NOISE

CROSS REFERENCE TO RELATED APPLICATIONS

This application is based upon, claims the benefit of priority of, and incorporates by reference the contents of Japanese Patent Application No. 2003-47473 filed on Feb. 25, 2003.

FIELD OF THE INVENTION

The present invention relates to a method and system for designing an integrated circuit and, more particularly, to a method and system for designing a bypass capacitor to be equipped to the integrated circuit that is mounted on a board.

BACKGROUND OF THE INVENTION

JP-A-2001-175702 (Patent Document 1) discloses a method of designing a circuit in which a bypass capacitor is equipped to an integrated circuit (IC). According to this circuit designing method, the capacitance of the bypass capacitor and the arrangement location thereof (the position at which the bypass capacitor is disposed) are preset and then circuit values, such as noise current, are estimated based on an impedance-frequency characteristic of the capacitor current path. This operation is repeated for optimizing the circuit design.

When the IC is mounted on a printed circuit board, a bypass capacitor (hereinafter referred to as a "capacitor") is equipped between the power supply terminals of the IC in order to reduce the introduction of external noise through a power supply path into the IC and noise externally output from the IC through the power supply path.

FIG. 5 shows a related art noise analyzing model for designing a capacitor mount circuit. In FIG. 5, Zcap represents the impedance of a capacitor 4 connected between the power supply terminals 2, 3 of the IC 1, Zpcb represents the impedance of an external circuit 7 connected between the power supply paths 5, 6 when viewed from the capacitor 4 to the opposite side to IC 1, Zptnv1 represents the impedance of a portion of the power supply path 5 extending from the power supply terminal 2 to the capacitor 4, Zptng1 represents the impedance of a portion of the power supply path 6 extending from the power supply terminal 3 of the IC 1 to the capacitor 4, Zptnv2 represents the impedance of a portion of the power supply path 5 extending from the capacitor 4 to the external circuit 7, and zptng2 represents the impedance of a portion of the power supply path 6 extending from the capacitor 4 to the external circuit 7.

When calculation is carried out by using this noise analysis, it is concluded that if the impedance of a current path P1 extending from the power supply terminal 2 of the IC 1 through the power supply path 5, the capacitor 4, and the power supply path 6 to the power supply terminal 3 of the IC 1 is lowered relative to the impedance of a current path P2 extending from one end terminal of the capacitor 4 through the power supply path 5, the external circuit 7 and the power supply path 6 and returning to the other terminal of the capacitor 4. Also, noise current flowing out from IC 1 to the external circuit 7 can be reduced. More particularly, according to the related art noise analysis model, it is concluded that the noise current can be reduced if the capacitor 4 is disposed in maximum proximity to IC 1.

However, when the device is actually mounted on a printed circuit board and the noise characteristic is measured, a reduction in noise current is not necessarily achieved by disposing the capacitor 4 in the vicinity of the IC 1. This is because the related art noise analysis model shown in FIG. 5 does not accurately represent the actual circuit. Accordingly, mount circuit designers have been required to repeatedly experiment (perform plural trials) with the capacitance values of the capacitor 4 and the arrangement locations thereof and make repeated estimations until the optimum estimation result is achieved. This must be done despite the calculation result described above.

SUMMARY OF THE INVENTION

The present invention has been implemented in view of the foregoing situation, and has an object to provide a mount circuit designing method, a mount circuit designing system and a mount circuit designing program for a bypass capacitor with which the optimum capacitance value and optimum arrangement location of the bypass capacitor can be easily and precisely determined when the bypass capacitor is equipped to an IC to be mounted.

According to a first aspect of the present invention, in a mount circuit design, the impedance of the inside of an IC which is viewed from the terminals of the IC connected to a bypass capacitor is newly considered in addition to the impedance of a current path passing via the bypass capacitor at the outside of IC which has been previously considered. According to the mount circuit designing method, not only the path passing via the bypass capacitor at the outside of IC, but also the path passing via the impedance of the inside of IC is considered as a path for noise current occurring inside the IC.

According this mount circuit design method, there is achieved a new design idea that it is effective to reflow the noise current to the path passing via the impedance of the inside of IC. According to this mount circuit designing method, the noise current can be calculated more closely and approximately to the actual mount circuit, and the optimum capacitance value of the bypass capacitor and the arrangement location thereof for reducing the noise current can be determined with high precision and without repeated trials.

According to a second aspect, attention is also paid to the impedance of the bypass capacitor serving as a main circuit element at the outside of the IC, the impedance of the external connection circuit of the IC and the impedance of wires through which the bypass capacitor and the external connection circuit are connected to each other. If the impedance of these elements is used, any arrangement construction can be represented by a generalized equivalent circuit even if it is complicated. Furthermore, the noise current calculated, and finally the capacitance value and arrangement location of the bypass capacitor can be achieved with sufficient precision.

According to a third aspect, the impedance of the bypass capacitor is first set, and then the intensity of the noise current flowing from the IC to the external connection circuit when a noise source is assumed to be located at the inside of IC is calculated while successively varying the value of the impedance at the inside of IC and the wire distance between the IC terminal and the bypass capacitor as parameters. This calculation may be performed by analytically solving a voltage/current equation based on each impedance or by using numerical calculation.

Once a calculation is made, it is unnecessary to make a recalculation insofar as the above specific bypass capacitor is afterwards used, and if the actual values of the impedance at the inside of IC are applied to the calculation result, the arrangement location of the bypass capacitor at which the noise current is minimum can be immediately determined. Furthermore, if the calculation is made while varying the capacitance value (impedance) of the bypass capacitor as needed, the capacitance value of the bypass capacitor can be determined.

According to a fourth aspect of the present invention, the noise current achieved through the calculation is represented as a noise current characteristic graph, so that it is easy for a mount circuit designer to carry out the above applying work and the estimation work, and working efficiency can be enhanced. Furthermore, the capacitance value of the bypass capacitor can be easily determined by comparing plural noise current characteristic graphs generated for each capacitance value.

According to a fifth aspect, the noise current characteristic graph is three-dimensionally displayed by setting a first axis as the impedance at the inside of IC; a second axis as the arrangement location of the bypass capacitor; and a third axis as the intensity of noise current. Also, the noise current characteristic graph may be two-dimensionally displayed by using color or gradation representation. Both graphical representations permit easy visual recognition for mount circuit designers and an enhancement in design efficiency.

According to a sixth aspect, the impedance at the inside of the IC is first set, and the intensity of noise current flowing from the IC to the external connection circuit when a noise source is assumed to be located at the inside of the IC is calculated while successively varying the value (capacitance value) of the impedance of the bypass capacitor and the wire distance between the IC terminal and the bypass capacitor.

With this method, once a calculation is made, it is unnecessary to make a re-calculation insofar as the above specific IC is afterwards used, and if the actual value of the impedance of the bypass capacitor is applied to the calculation result, the arrangement location of the bypass capacitor at which the noise current is a minimum can be immediately determined. Furthermore, if the calculation is made while varying the impedance at the inside of the IC as needed, the method is successively applicable to various ICs, and the working efficiency can be further enhanced. The noise current thus calculated may be represented as a noise current characteristic graph.

According to a seventh aspect, the impedance at the inside of IC may contain the impedance of bonding wires and a lead frame, so that high-precision design can be performed.

According to an eighth aspect, the IC and the bypass capacitor are mounted on a printed circuit board. Such an approach is broadly usable for the mount circuit design.

According to a ninth aspect, there is provided a system achieved by realizing the mount circuit designing method according to the first aspect, and in order to enhance the efficiency of the mount circuit design and shorten the design time, a computer equipped with a data input/output unit, an operating unit and a data accumulating unit is used as a design assist device. In this case, at least the process until the calculation step of the noise current may be carried out. The work of applying the actual circuit to the calculation result achieved may be carried out by not only a computer, but also a mount circuit designer.

According to a tenth aspect, there is provided a system achieved by realizing the mount circuit designing method according to the second aspect. The impedance data of the wire pattern, etc. with respect to the wiring distance are stored as circuit connection data in a data accumulating unit.

According to an eleventh aspect, there is provided a system achieved by realizing the mount circuit designing method according to the third embodiment. The calculation of the noise current while successively varying the impedance value at the inside of IC and the wire distance between the IC terminal and the bypass capacitor may be time consuming. Therefore, the mount circuit design can be designed and the design time can be shortened by using a computer.

According to twelfth and thirteenth aspects, there are provided systems achieved by realizing the mount circuit designing methods of the fourth and fifth embodiments. The noise current characteristic graph generated is output through a data input/output unit (display device, print device or the like).

According to a fourteenth aspect, on the basis of the calculation result on the noise current, an operating unit determines the capacitance value and arrangement location of the bypass capacitor for achieving the maximum reduction of noise current input/output to/from the IC. Thus, the efficiency of the mount circuit design can be further increased.

According to fifteenth and sixteenth aspects, there are provided mount circuit designing programs used by the operating unit in the mount circuit designing systems described in the ninth and fourteenth aspects, respectively.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

Preferred embodiments according to the present invention will be described hereunder with reference to the accompanying drawings.

Figure 2:
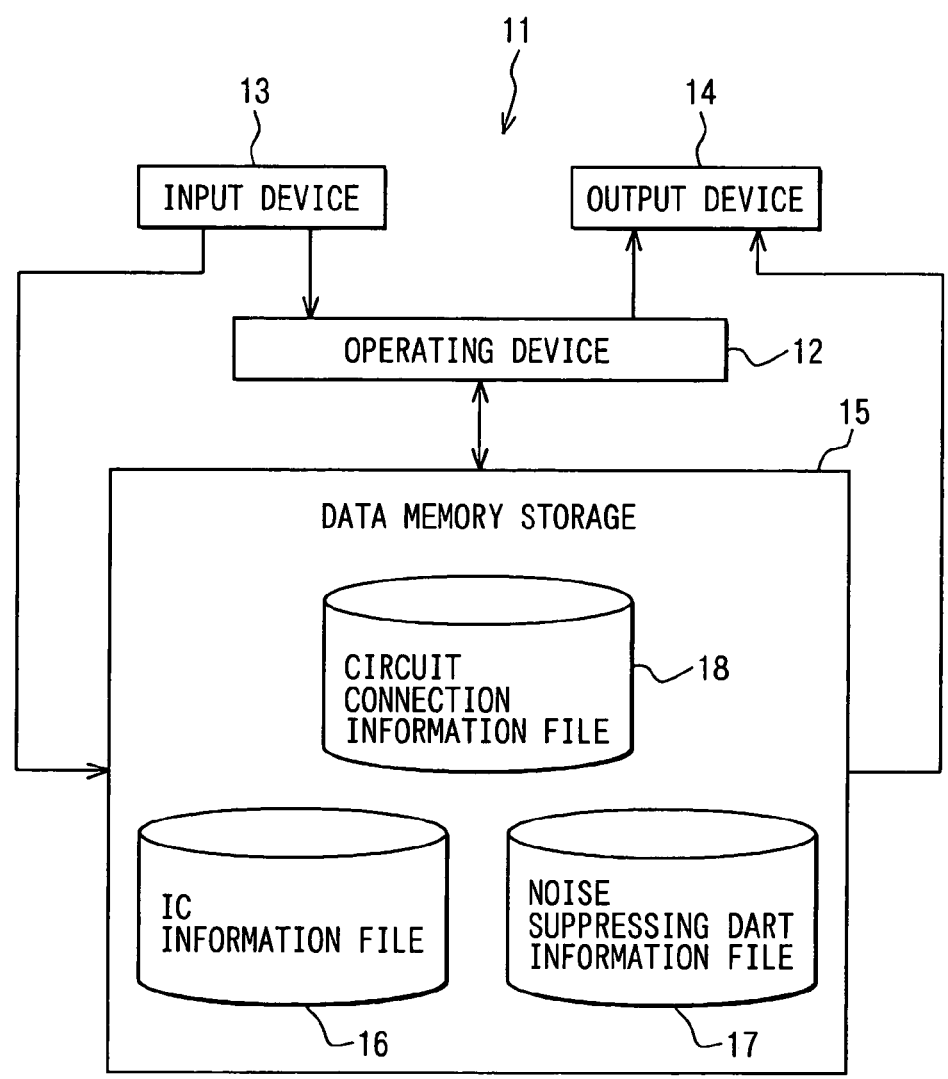
FIG. 2 is a block diagram of a mount circuit designing system.

Referring to the block diagram of FIG. 2, a system for designing a printed circuit board (mount circuit designing system) comprises a computer 11. The computer 11 comprises an operating unit (or operating device) 12 such as a central processing unit 12, an input device 13 such as a keyboard, a CD-ROM drive device, etc. (corresponding to the data input/output unit), an output device 14 comprising a display device such as CRT or the like and a print device such as a color printer or the like. The input device 13 and the output device correspond to a data input/output unit. The computer 11 includes a data storage device 15 comprising a memory and a hard disc device (corresponding to the data accumulating unit). The input device 13 and the output device 14 contain a communication unit for transmitting/receiving data through a network.

The operating device 12 executes amount circuit designing program stored in a memory to calculate noise current for each of plural ICs mounted on a printed circuit board (not shown) and to determine the capacitance value and optimum arrangement location of a bypass capacitor to reduce the noise current on the basis of the calculation result. Information on the IC and information on noise suppressing (countermeasure) parts are stored as a library file in the data storage device 15 prior to the execution of the mount circuit designing program. For example, design data of a CAD input through the communication unit may be used as this information.

Figure 1:
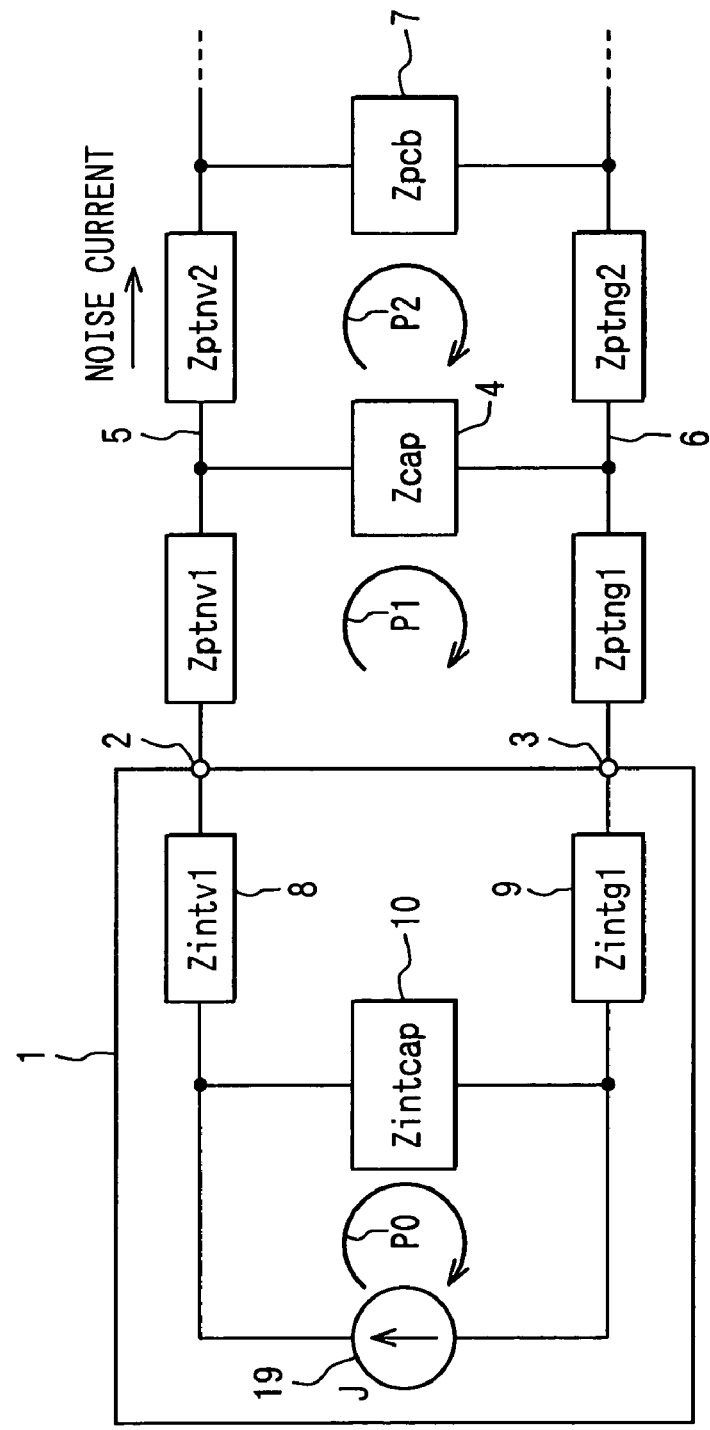
FIG. 1 is a block diagram of a noise analysis model used in a mount circuit design according to a preferred embodiment.
Figure 5:
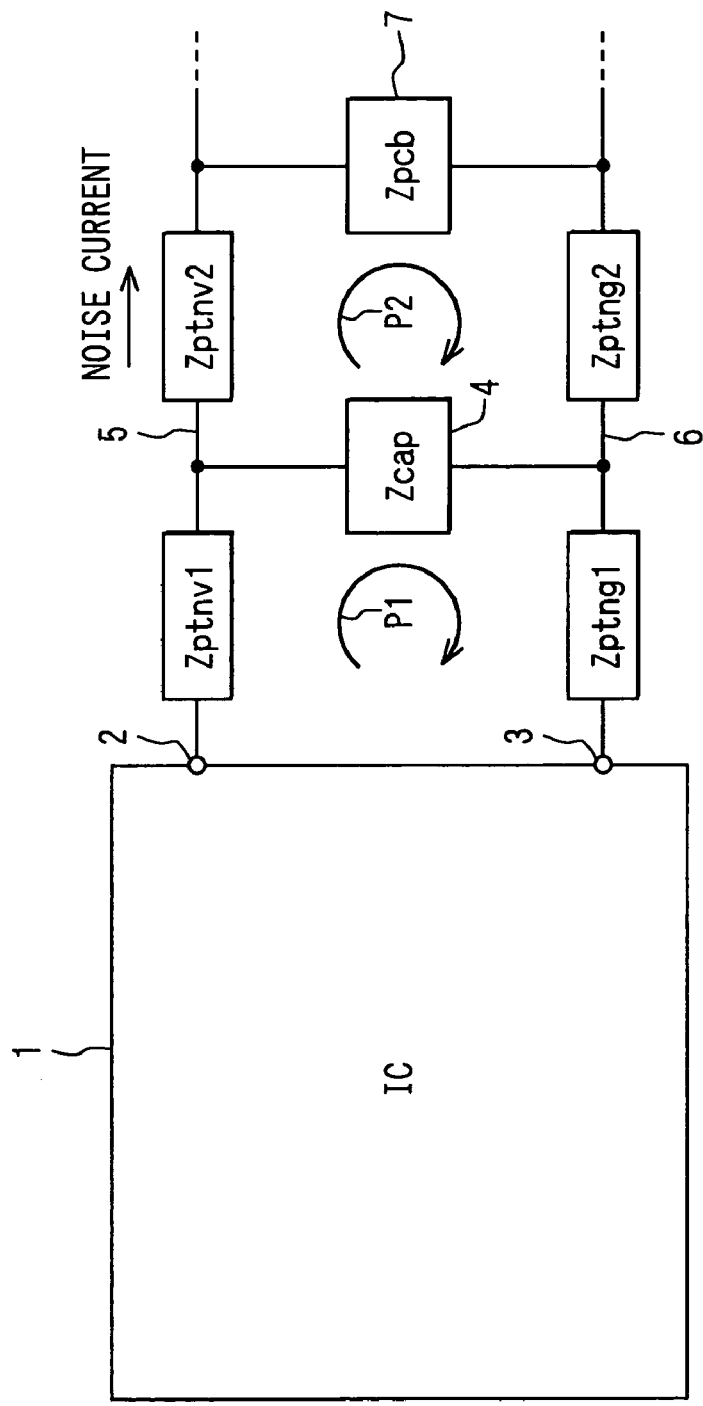
FIG. 5 is a block diagram of a related art noise analysis model.

FIG. 1 shows a noise analysis model used in the mount circuit design, and the same constituent parts as shown in FIG. 5 are represented by the same reference numerals. A power supply voltage (for example, 5V) is applied through the power supply paths 5, 6 to the power supply terminals 2, 3 (corresponding to the IC terminals) at the outside of an integrated circuit (IC) 1 mounted on the printed circuit board. A bypass capacitor 4 (hereinafter referred to as "capacitor 4") is connected between the power supply paths 5, 6 so as to be located in the neighborhood of the IC 1.

An external circuit 7 equivalently represents circuits connected to the power supply terminals 2, 3 of the IC 1 through the power supply paths 5, 6. The external circuit 7 may be a power supply circuit, other functional circuits, other ICs, the other power supply terminals of the IC 1 concerned, etc. Since the paths 5, 6 are power supply paths, the external circuit 7 generally represents capacitance. The impedance zcap, Zpcb, Zptnv1, Zptng1, Zptnv2, Zptng2 in FIG. 1 represent the same elements as described above with reference to FIG. 5.

With respect to the noise analysis model of the mount circuit designing system according to this embodiment, the impedance of the inside of the IC 1 concerned when viewed from the power supply terminals 2, 3 of the IC 1 is also taken into consideration. That is, an internal circuit 10 containing a bypass capacitor and other elements is connected through wires 8,9 comprising bonding wires and a lead frame between the power supply terminals 2, 3. In FIG. 1, Zintv1, Zintg1 represents the impedance of each of the wires 8, 9, and Zintcap represents the impedance (capacitance) of the internal circuit 10.

Furthermore, a noise current source 19 (corresponding to a noise source) is connected between the power supply terminals 2, 3 in order to calculate the noise current. The frequency components of the noise current J output from the noise current source 19 are approximate to the frequency components of the noise current output from the actual IC 1. Taking the impedance of the inside of the IC 1 into consideration as described above, a new current path P0 comprising the noise current source 19 and the internal circuit 10 appears.

Figure 3:
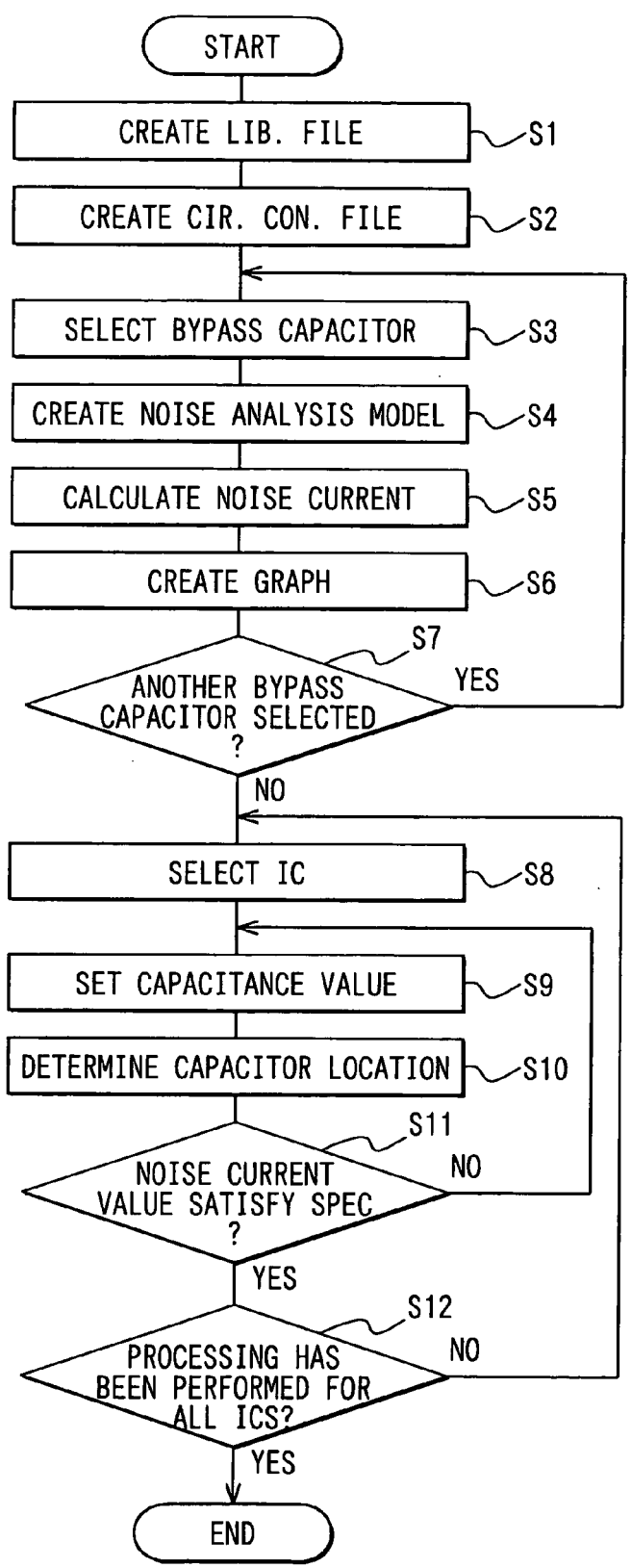
FIG. 3 is an exemplary flow diagram of the program executed by the mount circuit designing system.

Next, referring to FIG. 3, the mount circuit designing processing (program) executed by the computer 11 on the basis of the noise analysis model shown in FIG. 1 will be described. The mount circuit designing processing (program) comprises characteristic calculation processing steps S1 to S7 for generating a noise current characteristic graph (shown in FIG. 4 and discussed below) for each of plural capacitors 4 different in capacitance value, and characteristic applying processing steps S8 to S12 for determining the capacitance value and arrangement location of the capacitance 4 for every IC on the printed circuit board by using the noise current characteristic graph thus achieved.

First, the characteristic calculation processing steps will be described.

The operating device 12 inputs data necessary for characteristic calculation in step S1 from the input device 13, and creates a library file in the data storage device 15 on the basis of the data thus input. The library file comprises an IC information file 16 and a noise suppressing part information file 17.

The IC information file 16 contains data on the part name of each IC to be mounted on the printed circuit board, the part number of the IC concerned, pin information, the circuit constants of the inside of the IC when viewed from the power supply terminals 2, 3, the intensity and frequency components of the current noise occurring in the IC, etc. When plural power supply terminal pairs exist in the IC, the above data are contained in every pair. With respect to the circuit constants in these data, they are represented by the value of the capacitance components, the resistance components and the inductance components which are measured by using a network analyzer or the like. On the other hand, the noise suppressing part information file 17 contains the type, part number, shape, circuit constants (the values of capacitance components, resistance components, inductance components) of the noise suppressing parts such as the bypass capacitor, a reactor (not shown), etc.

After the library file is generated, the operating device 12 inputs from the input device 13 the mutual connection information of ICs which are actually arranged on the printed circuit board in step S2, and creates a circuit connection information file 18 on the basis of the mutual connection information. The circuit connection information file 18 contains the connection information of each IC arranged on the printed circuit board to the other circuits (other functional circuits, the other ICs, the other power supply terminals of the IC 1 concerned), that is, the circuit constants of the external circuit 7 and the circuit constant per length of each wire pattern when viewed from each IC.

The operating device 12 selects one bypass capacitor 4 from the noise suppressing part information file 17 according to the set condition input from the input device 13 in step S3, and creates a noise analysis model as shown in FIG. 1 for a predetermined frequency in step S4. This frequency is different in accordance with the type, function, etc. of the IC 1. For example, in the case of a microcomputer having a clock frequency of several MHz to several tens MHz, an FM band (76 MHz to 90 MHz) or a TV broadcasting band (90 MHZ to 108 MHZ) in which a primary higher harmonic wave appears may be used.

At this point, the impedance Zintcap of the internal circuit 10 of the IC 1, the impedance Zptnv1, Zptnv2 of the power supply paths 5, and the impedance Zptng1, Zptng2 of the power supply path 6 are still unknown. The noise current J of the noise current source 19, the impedance Zintv1, Zintg1 of the wires 8, 9 of the IC 1, the impedance Zpcb of the external circuit 7 and the wire distance between IC 1 and the external circuit 7 are set to standard values (these values may be properly set in accordance with the mount state).

When the frequency used for the analysis is predetermined, the circuit constant data contained in the IC information file 16, the noise suppressing part information file 17 and the circuit connection information file 18 may be set to the impedance data for the frequency concerned. In this case, the IC information file 16 contains the data of the impedance of the inside of IC, the noise suppressing part information file 17 contains the data of the impedance of the capacitor, and the circuit connection information file 18 contains the data of the impedance of the external circuit and the data of the wire impedance for the wire distance between IC and the capacitor.

Thereafter, the operating device 12 calculates the noise current flowing from IC 1 to the external circuit 7, more specifically, the noise current flowing through the impedance Zptnv2 of the power supply path 5 extending from the capacitor 4 to the external circuit 7 in step S5. At this time, the impedance value is substituted into an analysis solution of the voltage/current equation. A numerical calculation may be performed while successively varying the impedance Zintcap of the inside of the IC 1 and the impedance between IC 1 and the capacitor 4 as parameters. When the calculation is finished, the processing shifts to step S6 to create the noise current characteristic graph, and then display and print the noise current characteristic graph thus created on/from the output device 4.

Figure 4:
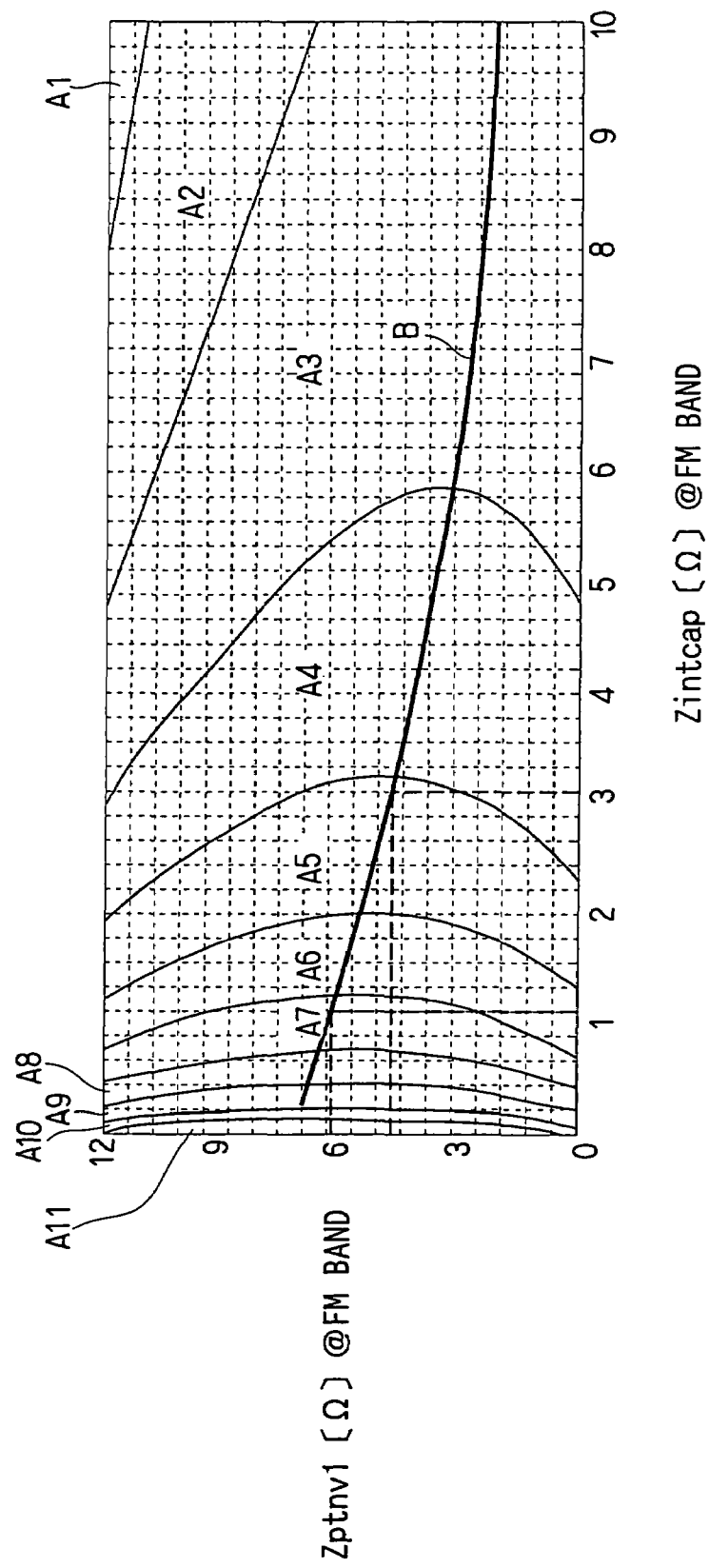
FIG. 4 is a noise current characteristic graph.

FIG. 4 shows an exemplary noise current characteristic graph when the frequency is set to 96 MHz. The abscissa axis (corresponding to a first axis) represents the internal impedance Zintcap [Ω] of the IC 1, and the ordinate axis (corresponding to a second axis) represents the impedance Zptnv1 [Ω] of the portion of the power supply path 5 extending from the power supply terminal 2 of the IC 1 to the capacitor 4. The difference in intensity of the noise current is represented by the respective areas A1 to A11, which are partitioned every 3 dB in FIG. 4. That is, the noise current is largest in the area A1 at the upper right side of FIG. 4, and it is gradually reduced as the area is shifted from the area A2 to the subsequent areas A11 at the lower left side. Finally, the noise current is a minimum in the area A11 at the far left side of FIG. 4. The noise current characteristic graph is preferably displayed with colors on the actual screen. A minimum value instructing line B which is drawn downwardly inclined to the right side in FIG. 4 shows the impedance Zptnv1 for each impedance Zintcap when the noise current is minimum.

When the calculation in the case of use of one capacitor 4 is completed, the operating device 12 determines in step S7 whether the calculation should be performed on the capacitors 4 having other capacitance values according to the set condition described above. Here, if "YES" is determined, the processing returns to step S3 to select another capacitor 4 having a different capacitance value and to create a noise current characteristic graph. If "NO" is determined, the characteristic calculation processing step is finished, and then the processing goes to the next characteristic applying processing step.

The characteristic applying processing step is performed as follows. The operating device 12 selects IC 1 mounted on the printed circuit board in step S8. Thereafter, it reads out the circuit constants of the internal circuit 10 of the IC 1 from the IC information file 16 stored in the data storage device 15, and calculates the impedance Zintcap at the frequency of 96 MHz. Subsequently, it sets the capacitance value of the capacitor 4 to a value predetermined as a standard value in step S9. In step S10, the internal impedance Zintcap of the IC 1 concerned is applied to the noise current characteristic graph for the capacitance 4 having the above capacitance value to achieve the impedance Zptnv1 corresponding to the minimum value instruction line B at that time. The impedance Zptnv1 is equivalent to the wire distance between IC 1 and the capacitor 4, so that the arrangement location of the capacitor 4 at which the noise current is minimized can be accurately determined.

Thereafter, the operating device 12 judges in step S11 whether the absolute value of the noise current satisfies a design specification value. Here, if it is judged in step S11 that the noise current value does not satisfy the design specification value (i.e., "NO" is judged), the processing goes to step S9 to increase the capacitance value of the capacitor 4 from the present value (standard value) by a predetermined value, and then the processing containing the step S9 and the subsequent steps is carried out again. If it is judged in step S11 that the noise current value satisfies the design specification value (i.e., "YES" is judged), the processing goes to step S12 to judge whether the processing has been performed for all ICs mounted on the printed circuit board. If the processing has been carried out on all the ICs, "YES" is judged and the characteristic applying processing step is finished. If it has not yet been finished, "NO" is judged, the processing returns to step S8 to select the next IC 1 and continue the processing.

The noise current characteristic graph of FIG. 4 exhibits a characteristic different from that achieved according to the related art designing method. According to the related art method, it has been estimated that as the capacitor 4 is disposed to be closer to IC 1, the impedance of the current path P1 shown in FIG. 1 is lowered, so that the noise current flowing in the current path P2 is reduced. That is, according to the related art, the optimum arrangement location of the capacitor 4 is the nearest position to IC 1.

The noise current characteristic graph shown in FIG. 4 may lead to a different conclusion. For example, when attention is paid to a case where the internal impedance Zintcap of the IC 1 is equal to 1[Ω], the wire impedance Zptnv1 of the minimum value instruction line B on which the noise current is minimum is equal to 6[Ω]. This is also apparent from the fact that the nearest portion of the IC 1 (Zptnv1=0[Ω]) is contained in the area A6 whereas the vicinity to the portion (Zptnv1=7[Ω]) is contained in the area A7 which is smaller in noise current by 3 dB than the area A6. However, when the internal impedance Zintcap of the IC 1 is equal to 3[Ω], it is also apparent that the arrangement location at which the noise current is minimum is not the nearest portion to IC 1, but the position corresponding to the wire distance between IC 1 and the capacitor 4 at which the wire impedance Zptnv1 is equal to 5[Ω]. When an actual measurement is carried out on the basis of the above result by using an actual printed circuit board, it has been confirmed that the noise can be reduced by 2.4 dB as compared with the case where the capacitor 4 is disposed to be nearest to IC 1.

Such a result is achieved by using the noise analysis model in which the impedance of the internal circuit 10 is taken into consideration in addition to the impedance of the external circuit of the IC 1. According to this model, the current path P0 along which the impedance Zintcap re-flows into IC 1 as shown in FIG. 1 is formed, and noise current is determined on the basis of the relationship between the current path P0 inside IC 1 and the current paths P1, P2 at the outside of the IC 1. Here, it is necessary to reduce the impedance of the current path P1 with respect to the impedance of the current path P2. If the impedance of the current path P1 is excessively reduced, the impedance of the current path P0 is relatively higher than the impedance of the current path P1, and a large amount of noise current which should be originally re-flowed along the current path P0 flows out to the current path P1 having lower impedance (to the outside of the IC 1).

That is, the noise current is more liable to flow to the current path having lower impedance. Therefore, if the impedance of the current path P1 is excessively reduced, the noise current is more liable to flow out to the outside of the IC 1. On the other hand, if the impedance of the current path P1 is excessively increased, the noise current is more liable to flow to the current path P2. For this reason, the minimum value instruction line B is located at neither the nearest position to IC 1 nor the farthest position from IC 1, but located at the intermediate position therebetween as shown in FIG. 4.

As described above, the mount circuit designing system of this embodiment is characterized by using the noise analysis model in which the impedance Zintcap of the internal circuit 10 when viewed from the power supply terminals 2, 3 of the IC 1 connected to the capacitor 4 is also considered in addition to the impedance of the current path passing via the capacitor 4 at the outside of the IC 1 which has been hitherto considered. Accordingly, the current paths P1, P2 at the outside of the IC 1 and the current path P0 inside IC 1 are considered as the paths for current noise occurring inside IC 1.

As a result, as compared with the related art design idea that it is effective to reflow the noise current to the current path P1 by reducing the impedance Zptnv1, Zptng1 between the power supply terminal 2, 3 of the IC 1 and the capacitor 4, the mount circuit designing method of this embodiment achieves a novel designing idea that it is effective to reflow the noise current to the current path P0 passing via the internal impedance Zintcap of the IC 1.

According to the mount circuit design of this embodiment, the noise current closer to that of the actual mount circuit can be calculated, and thus the optimum capacity value of the capacitor 4 and the optimum arrangement location of the capacitor 4 to reduce the noise current can be determined with high precision without repeated trials or experimentation. If the noise current flowing from IC 1 to the external circuit 7 is reduced, it would be expected that noise current flowing from the external into IC 1 can be reduced. This point can be more accurately estimated by equipping a noise current source at the outside of IC and applying the above-described designing method.

The calculation of the noise current is carried out in consideration of the impedance Zcap of the capacitor 4, the impedance Zpcb of the external circuit 7 of the IC 1 and the impedance Zptnv1, Zptng1, Zptnv2, Zptng2 of wires for connecting the capacitor 4 and the external circuit 7 as the impedance elements at the outside of the IC 1, and also in consideration of the impedance Zintcap of the internal circuit 10 as the impedance element at the inside of the IC 1. By using these impedance elements, even a complicated arrangement configuration can be represented by a generalized equivalent circuit. Accordingly, sufficient precision can be achieved for the noise current thus calculated, and thus the capacity value and arrangement location of the capacitor 4.

Furthermore, with respect to the noise current calculation, the computer 11 is used to enhance the efficiency of the mount circuit design and also shorten the design time. The value of the noise current is output as a noise current characteristic graph using the internal impedance Zintcap of the IC 1 and the wire impedance Zptnv1 between IC 1 and a specific capacitor 4 as parameters with respect to the impedance Zcap of a specific capacitor 4, and thus the designing work and estimating work of the mount circuit designer can be facilitated. In addition, the noise current characteristic graph is easily viewable for the mount circuit designer because the intensity of the noise current is two-dimensionally displayed with stepwise variation of color, so that the designing efficiency can be enhanced.

Once the noise current is calculated, it is unnecessary to repeat the calculation afterwards insofar as the capacitor 4 is used. If the internal impedance Zintcap of the actual IC 1 is applied to the calculation result, the arrangement location of the capacitor 4 at which the noise current is minimum can be immediately determined. Furthermore, since the noise current is calculated for plural types of capacitors 4 in advance and the noise current characteristic graph is created, not only the arrangement location of the capacitor 4, but also the capacitance value thereof can be determined while estimating the absolute value of the noise current.

The impedance Zintv1, Zintg1 of the wires 8, 9 such as the bonding wires and the lead frame are considered as the impedance of the inside of the IC 1, and thus higher-precision design can be performed.

The present invention is not limited to the above embodiment, and various modifications or expansion can be performed as follows.

That is, the noise current characteristic graph may be expressed by using gradation representation in place of the color display. Furthermore, the noise current characteristic graph may be three-dimensionally displayed by setting the internal impedance zintcap of the IC 1 on the first axis, setting the wire impedance Zptnv1 between IC 1 and the capacitor 4 on the second axis and setting the intensity of the noise current on the third axis.

In the calculation of the noise current and the creation of the noise current characteristic graph, the wire distance between IC 1 and the capacitor 4 may be used in place of the impedance Zptnv1 between IC 1 and the capacitor 4.

Furthermore, the above embodiment may be modified so that the internal impedance Zintcap of the IC 1 is set, and the intensity of the noise current is calculated while successively varying the impedance Zcap of the capacitor 4 and the wire impedance Zptnv1 between IC 1 and the capacitor 4 as parameters. In this case, the noise current characteristic graph may be represented by color variation or gradation representation while the impedance Zcap of the capacitor 4 is set on the first axis, the wire impedance Zptnv1 between IC 1 and the capacitor 4 is set on the second axis and the intensity of the noise current is set on the third axis, whereby the capacitance value and arrangement location of the bypass capacitor can be determined.

The characteristic applying processing step involves applying the pre-measured internal impedance Zintcap of the IC 1 to the noise current characteristic graph, and thus the mount circuit design himself/herself may carry out this work.

The mount circuit designing method described above may be applied to not only the power supply terminals 2, 3 of the IC 1, but also a reference voltage terminal, a voltage input/output terminal, etc.

The impedance Zintv1, Zintg1 of the wires 8, 9 comprising the bonding wires and the lead frame may be considered in accordance with the design precision or the like as occasion demands.

What is claimed is:

1. A method for designing a bypass capacitor that is to be equipped to an IC, the method comprising:
    calculating noise current flowing outside of the IC for a capacitance value and arrangement location of the bypass capacitor on the basis of an impedance of a current path passing via the bypass capacitor outside of the IC and an impedance of an inside of the IC when viewed from IC terminals connected to the bypass capacitor; and
    determining the capacitance value and arrangement location of the bypass capacitor based upon the noise current.

2. The method according to claim 1, wherein the calculating of the noise current further comprises calculating the noise current based upon the impedance of a circuit extending from one of the IC terminals to the bypass capacitor, the impedance of the bypass capacitor and the impedance of an external connection circuit outside of the IC when viewed from the bypass capacitor.

3. The method according to claim 2, wherein:
the calculating of the noise current further comprises specifying the impedance of the bypass capacitor, and calculating an intensity of noise current flowing from the IC to the external connection circuit when a noise source is assumed to exist inside the IC and while successively varying the value of the impedance of the inside of the IC and a wire distance between the one of the IC terminals and the bypass capacitor.

4. The method according to claim 3, further comprising creating a noise current characteristic graph representing the calculated noise current.

5. The method according to claim 4, wherein the creating of the noise current characteristic graph further comprises representing the noise current characteristic graph with color variation or gradation representation while the impedance of the inside of the IC is set on a first axis of the graph, the impedance or wire distance between the one of the IC terminals and the bypass capacitor is set on a second axis of the graph and the intensity of the noise current is set on a third axis of the graph.

6. The method according to claim 2, wherein:
the calculating of the noise current further comprises specifying the impedance of the inside of the IC, and calculating an intensity of noise current flowing from the IC to the external connection circuit when a noise source is assumed to exist inside the IC while successively varying the value of the impedance of the inside of the IC and a wire distance between the one of the IC terminals and the bypass capacitor; and
the determining of the capacitance value and arrangement location of the bypass capacitor is performed with respect to the IC on the basis of the calculated noise current and the impedance of the actual bypass capacitor.

7. The method according to claim 1, wherein the impedance of the inside of the IC contains the impedance of bonding wires and a lead frame.

8. The method according to claim 1, wherein the IC and the bypass capacitor are mounted on a printed circuit board.

9. A mount circuit designing system for performing a mount circuit design for a bypass capacitor to be mounted by an IC, the system comprising:
an operating unit for calculating noise current flowing outside of the IC for a capacitance value and an arrangement location of the bypass capacitor on the basis of an impedance of a current path passing via the bypass capacitor at the outside of the IC and an impedance of an inside of the IC when viewed from an IC terminal connected to the bypass capacitor, the operating unit further operable for determining the capacitance value and the arrangement location of the bypass capacitor based upon the calculated noise current.

10. The mount circuit designing system according to claim 9, further comprising a data accumulating unit for accumulating data, wherein the data includes data regarding an impedance of a circuit extending from the IC terminal to the bypass capacitor with respect to a wire distance between the IC terminal and the bypass capacitor, data regarding an impedance of the bypass capacitor, data regarding an impedance of an external connection circuit side of the IC when viewed from the bypass capacitor with respect to the wire distance between the IC terminal and the bypass capacitor, and data regarding the impedance of the inside of the IC, wherein the operating unit calculates the noise current by using the data accumulated in the data accumulating unit.

11. The mount circuit designing system according to claim 10, wherein by using the data accumulated in the data accumulating unit, the operating unit calculates an intensity of the noise current flowing from the IC to the external connection circuit when a noise source is assumed to exist inside the IC while successively varying the impedance of the inside of the IC and the wire distance between the IC terminal and the bypass capacitor under the condition that the impedance of the bypass capacitor is set.

12. The mount circuit designing system according to claim 11, wherein the operating unit creates a noise current characteristic graph representing the noise current achieved through the calculation.

13. The mount circuit designing system according to claim 12, further comprising a data input/output unit for outputting a noise current characteristic graph represented with color variation or gradation representation while the impedance of the inside of the IC is set on a first axis of the noise current characteristic graph, the impedance or wire distance between the IC terminal and the bypass capacitor is set on a second axis of the noise current characteristic graph and the intensity of the noise current is set on a third axis of the noise current characteristic graph.

14. A mount circuit designing program for executing a mount circuit designing program for a bypass capacitor equipped to an IC to be mounted, the mount circuit designing program when installed on a computer readable medium and executed by an operating device resulting in the operating device:
inputting data regarding an impedance of a current path passing via the bypass capacitor at an outside of the IC, and data regarding an impedance of an inside of the IC when viewed from an IC terminal connected to the bypass capacitor;
calculating noise current flowing to the outside of the IC with respect to the capacitance value and arrangement location of the bypass capacitor on the basis of the impedance data thus input; and
determining the capacitance value and arrangement location of the bypass capacitor on the basis of a calculation result achieved through the noise current calculation step.

* * * * *